(12) United States Patent
Guse

(10) Patent No.: US 9,673,661 B2
(45) Date of Patent: Jun. 6, 2017

(54) TRANSFER SWITCH WITH MONITOR ON LOAD SIDE

(71) Applicant: Kohler Co., Kohler, WI (US)

(72) Inventor: Gregory Guse, Plymouth, WI (US)

(73) Assignee: Kohler, Co., Kohler, WI (US)

( * ) Notice: Subject to any disclaimer, the term of this patent is extended or adjusted under 35 U.S.C. 154(b) by 770 days.

(21) Appl. No.: 14/062,210

(22) Filed: Oct. 24, 2013

(65) Prior Publication Data

US 2015/0115743 A1    Apr. 30, 2015

(51) Int. Cl.
| | |
|---|---|
| *H01H 47/00* | (2006.01) |
| *H01H 35/00* | (2006.01) |
| *H01H 83/18* | (2006.01) |
| *H02H 3/02* | (2006.01) |
| *H02J 9/06* | (2006.01) |
| *G01R 21/00* | (2006.01) |

(52) U.S. Cl.
CPC ............... *H02J 9/06* (2013.01); *G01R 21/00* (2013.01); *Y10T 307/832* (2015.04)

(58) Field of Classification Search
CPC ................................ H02J 9/066; G01R 21/00
USPC .......................................................... 307/126
See application file for complete search history.

(56) References Cited

U.S. PATENT DOCUMENTS

| | | | |
|---|---|---|---|
| 6,172,432 B1 | 1/2001 | Schnackenberg et al. | |
| 6,876,103 B2 | 4/2005 | Radusewicz et al. | |
| 7,005,760 B2 | 2/2006 | Eaton et al. | |
| 7,157,811 B2 | 1/2007 | Eaton et al. | |
| 7,259,481 B2 | 8/2007 | Eaton et al. | |
| 7,928,604 B2 | 4/2011 | Page | |
| 8,004,115 B2 | 8/2011 | Chapel et al. | |
| 8,022,579 B2 | 9/2011 | Groff et al. | |
| 2005/0116814 A1* | 6/2005 | Rodgers | H02J 3/14 340/538 |
| 2009/0015065 A1 | 1/2009 | Becigneul et al. | |
| 2011/0254370 A1* | 10/2011 | Wischstadt | G05B 15/02 307/39 |
| 2012/0146417 A1* | 6/2012 | Rasmussen | H02J 9/06 307/64 |
| 2012/0267957 A1 | 10/2012 | Czarnecki | |
| 2013/0116840 A1 | 5/2013 | Mauk et al. | |
| 2013/0138258 A1 | 5/2013 | Mauk et al. | |
| 2013/0158726 A1 | 6/2013 | Mauk | |

FOREIGN PATENT DOCUMENTS

WO    WO2010044610    4/2010

* cited by examiner

*Primary Examiner* — Carlos Amaya
(74) *Attorney, Agent, or Firm* — Lempia Summerfield Katz LLC

(57) ABSTRACT

A transfer switch selectively couples at least two power sources to a load. The load may be a home, business, or vehicle. A current transformer is coupled to the output of the transfer switch and generates a load measurement signal that is proportional to the current or power output from the transfer switch. A controller receives the load measurement signal and a switch setting describing the operation of the switch. The controller generates data for a status message for display based on the load measurement signal and the switch setting. The status message may describe the power consumption of the load or indicate when an error has occurred.

20 Claims, 13 Drawing Sheets

TRANSFER SWITCH WITH MONITOR ON LOAD SIDE

TECHNICAL FIELD

This disclosure relates in general to the measurement of an electrical load of a transfer switch, or more particularly, to a home monitoring system utilizing the measurement of an electrical load of a transfer switch.

BACKGROUND

Businesses and residences normally receive power from a utility company. The reliability of the power company depends on many factors such as the weather, usage spikes, short circuits, accidents or other damage to transmission lines or power stations. Certain locations may be particularly prone to blackouts. Low lying areas may be susceptible to floods. Coastal areas may be susceptible to hurricanes. High usage geographic areas may be susceptible to rolling blackouts.

Any breaks in power utility service may be unacceptable to customers, and some businesses may have mission critical systems, such as computer systems in call centers or refrigerators in grocery stores, that rely on constant power. In other businesses such as hospitals, lives may be lost if the power to a respirator is interrupted. These customers may rely on a backup source of powers.

One backup source of power is a generator. The generator and the utility company may be connected to the electrical system of a customer through a transfer switch. The transfer switch is often a simple switch without any feedback provided to the customer.

BRIEF DESCRIPTION OF THE DRAWINGS

Exemplary implementations are described herein with reference to the following drawings.

DETAILED DESCRIPTION

Figure 1:
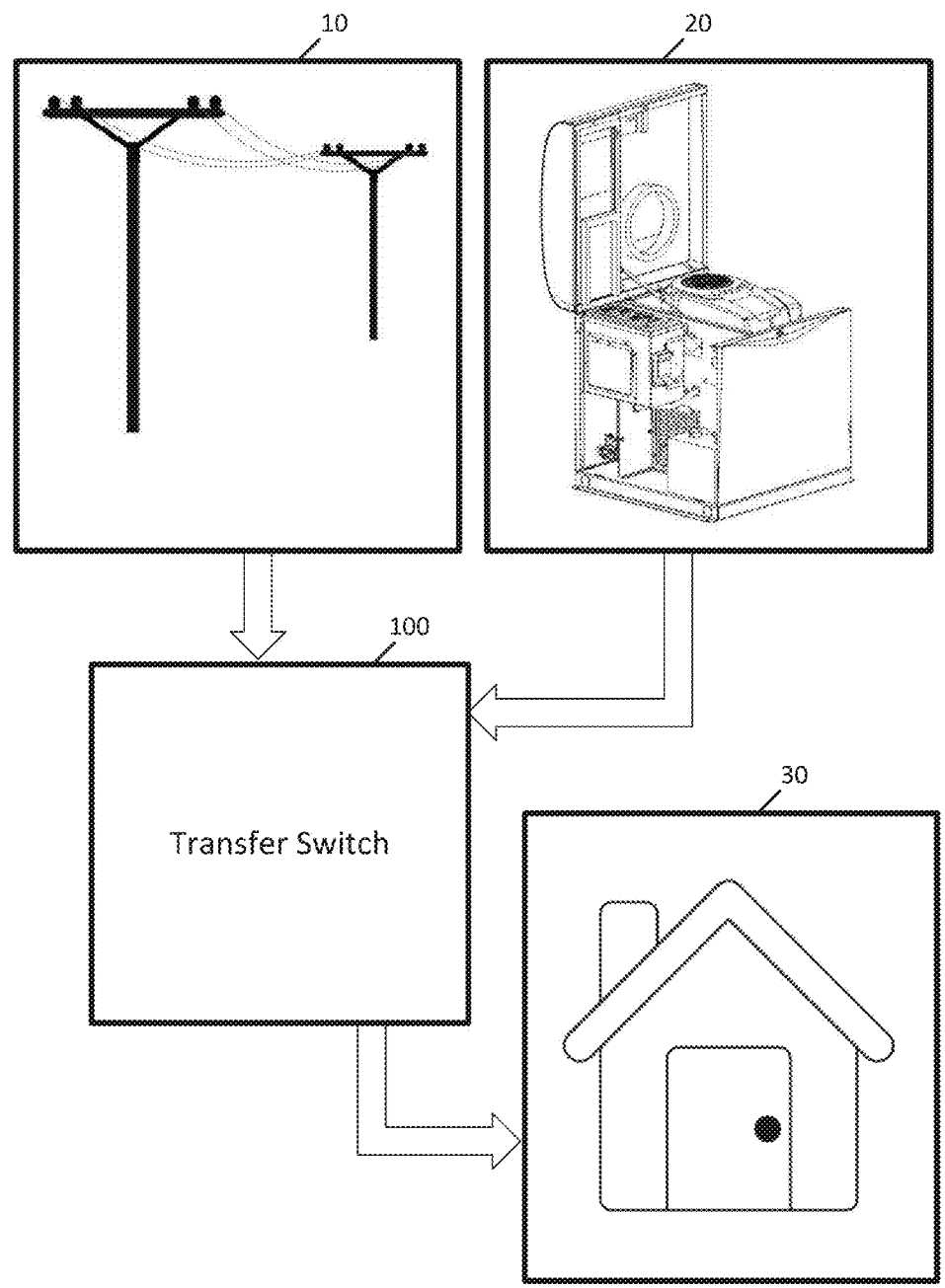
FIG. 1 illustrates an example power system.

FIG. 1 illustrates an example power system. The power system includes a primary source 10, a generator 20, a load entity 30, and a transfer switch 100. The generator 20 may include a single generator or parallel generators. The generator 20 may provide primary or backup power to the load entity 30, which may be one or more homes, businesses, vehicles, boats, or another power consuming entity. The primary source 10 may be a utility (e.g., the power company), another generator, a solar power source, a wind power source, or another alternative power source for the load entity 30, and the generator 20 may be the backup power supply for the load entity 30. In backup systems, the operation of the generator 20 may be triggered in response to failure in the primary source 10. The failure may be a partial or a complete loss of power. In a partial loss of power, both the primary source 10 and the generator 20 may supply power to the load. The failure in the primary source 10 may also be based on price. That is, a failure may be identified when the cost of the primary source 10 exceeds that of the generator 20, triggering a complete or partial switch to the generator 20. When there are multiple, parallel generators in the system, the generator 20 may provide varying amounts of power to the load.

The transfer switch 100 may include a circuit for the measurement of current or power usage of the load entity 30. Data that represents the measured usage may be used to monitor the output or performance of the generator 20, output or performance of the primary source 10, or consumption of the load entity 30. The measured usage may also be used to audit billing or other measurements made by the utility company or a utility meter.

Because the circuit may be positioned with, and monitoring may take place in, the transfer switch 100, multiple power sources from different providers may be monitored without disrupting existing mechanisms from delivering power from the utility or one or more generators. In other words, the utility or another power source may be monitored independently and without altering any utility or power source equipment. In addition, when the circuit for the measurement of current or power usage is located on the load, this information may be combined with usage at the generator 20 to infer how much power is provided by the primary source 10, without directly testing the primary source 10.

Figure 2:
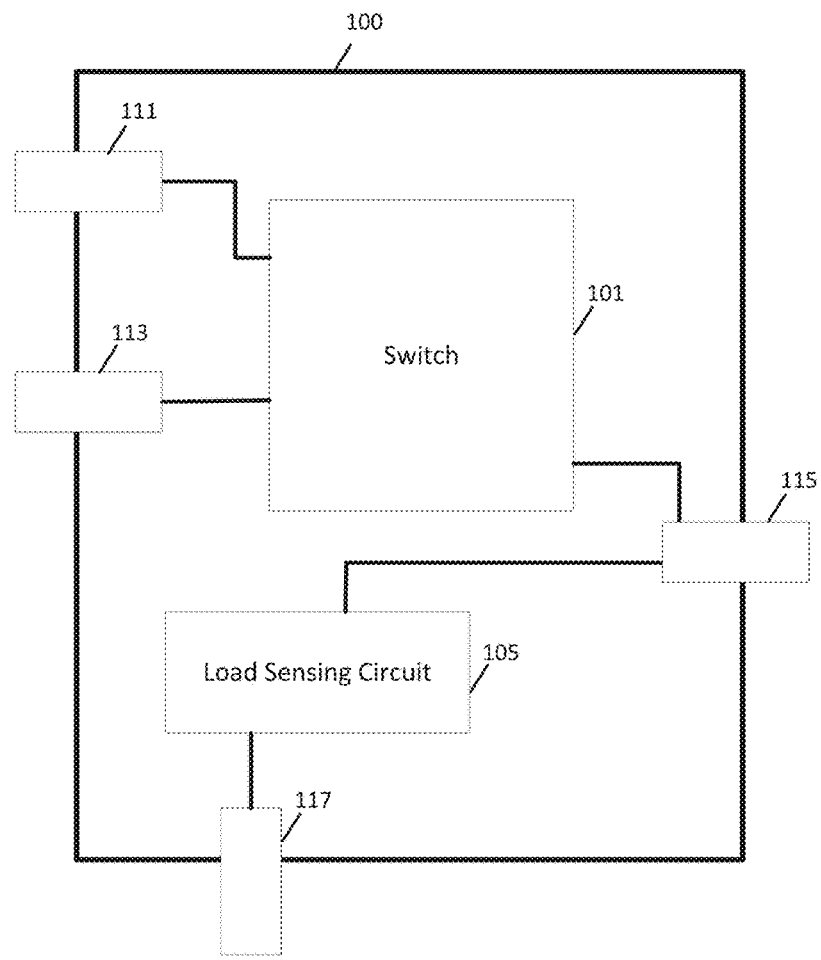
FIG. 2 illustrates an example transfer switch of FIG. 1.

FIG. 2 illustrates an example of the transfer switch 100 of FIG. 1. The transfer switch 100 may include a switch 101 and at least one sensing circuit. The example transfer switch 100 of FIG. 2 includes a load sensing circuit 105. However, in other examples, a generator sensing circuit, a utility sensing circuit or both may be included. In one example, the load sensing circuit 105 may be omitted and both a generator sensing circuit and a utility sensing circuit may be included. In any of these examples, one or more of the sensing circuits may include an instrument transformer. Example instrument transformers include current transformers and voltage transformers. The instrument transformer may measure current or voltage in any type of circuit but may be used in high current circuits, in which other measurement techniques cannot be used.

A current transformer may produce an output current proportional to a sensed current. The current transformer may include a primary winding, a second winding, and a core. The core may be formed of a magnetic material such as copper. The secondary winding may be wire wrapped many times around the core. The primary winding may pass through the core or be wrapped around the core a few times. The primary winding may also be a portion of the measured circuit.

The transfer switch 100 may include multiple connections. A utility input 111 may be in electrical communication with the primary source 10. A generator input 113 may be in electrical communication with the generator 20, which may include parallel generators. The utility input 111 and the generator input 113 may be or represent first and second input ports for receiving alternating current from first and second power sources. A control port 115 may be in data and/or electrical connection with a generator controller. A load output 117 may be in electrical communication with the load entity 30.

The load sensing circuit 105 may receive a load measurement signal from a current transformer electrically coupled to an output of the transfer switch 100 connected to the generator 20. The transfer switch 100 may be an automatic transfer switch that automatically initiates operation of the generator 20 when the primary source 10 drops in power below a threshold level or fails, or may be a manual or mechanical transfer switch. The drop in the primary source 10 may be derived from the load sensing circuit 105 or another measurement made directly on the power from the primary source 10.

The load measurement signal may be proportional to the sensed current or voltage of the transfer switch 100 via the load output 117. Alternatively, the load sensing circuit 105 may include a measurement circuit and output a data signal indicative of the current or voltage of the sensed circuit. The measurement circuit may include an analog to digital converter and output a digital signal for the current or voltage of the sensed circuit.

The load sensing circuit 105 may receive a switch setting from the switch 101. The switch setting may indicate that only the primary source 10 is supplying power or only utility input 111 is receiving power. The switch setting may alternatively indicate that only the generator 20 is supplying power or only generator input 113 is receiving power. The switch setting may indicate that both the primary source 10 and the generator 20 are supplying power. The switch setting may also include data that indicate the ratio between the power from the primary source 10 and the power from the generator 20.

The load sensing circuit 105 may include logic for processing a load measurement signal from the current transformer. The load sensing circuit 105 may generate a status message for display based on one or both of the load measurement signal and the switch setting. The status message may indicate the current or power consumption of the load entity 30 and/or a source of the power. For example, when the switch setting indicates that only primary source 10 is being used, the status message may display text or graphics to describe that the generator 20 is offline. When the switch setting indicates that the generator 20 is being used, this may be reflected in the status message. When the switch setting indicate a ratio between the power from the primary source 10 and power from the generator 20, the status message may indicate the portion of the power consumption of the load entity 30 generated by the generator 20.

Figure 3:
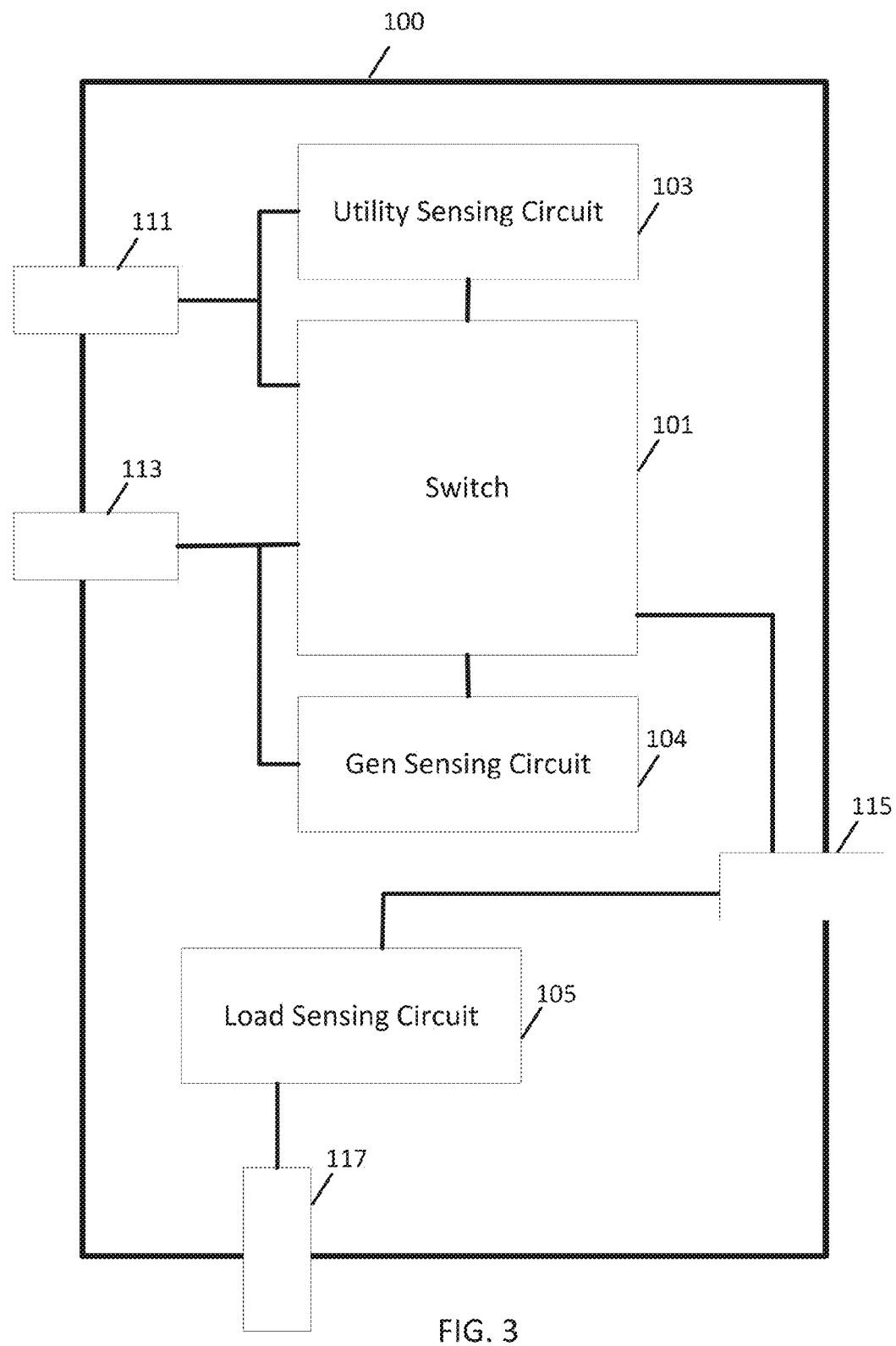
FIG. 3 illustrates an example transfer switch of FIG. 1.

FIG. 3 illustrates another example transfer switch 100. The transfer switch 100 may include two or three sensing circuits, such as two or more of a load sensing circuit 105, a utility sensing circuit 103, and a generator sensing circuit 104. The voltage, power, or current at the load output 117 may be measured directly by the load sensing circuit 105, or when the load sensing circuit 105 is omitted, from the sum of measurements made at the utility sensing circuit 103 and the generator sensing circuit 104. The voltage, power, or current at the generator input 113 may be measured directly by the generator sensing circuit 104, or when the generator sensing circuit 104 is omitted, from the difference between measurements made at the load sensing circuit 105 and the utility sensing circuit 103. The voltage, power, or current at the utility input 111 may be measured directly by the utility sensing circuit 103, or when the utility sensing circuit 103 is omitted, from the difference between measurements made at the load sensing circuit 105 and the generator sensing circuit 104. In these examples, the transfer switch 100 may include any two or all three of the above-described sensing circuits. Other variations are possible.

Figure 4:
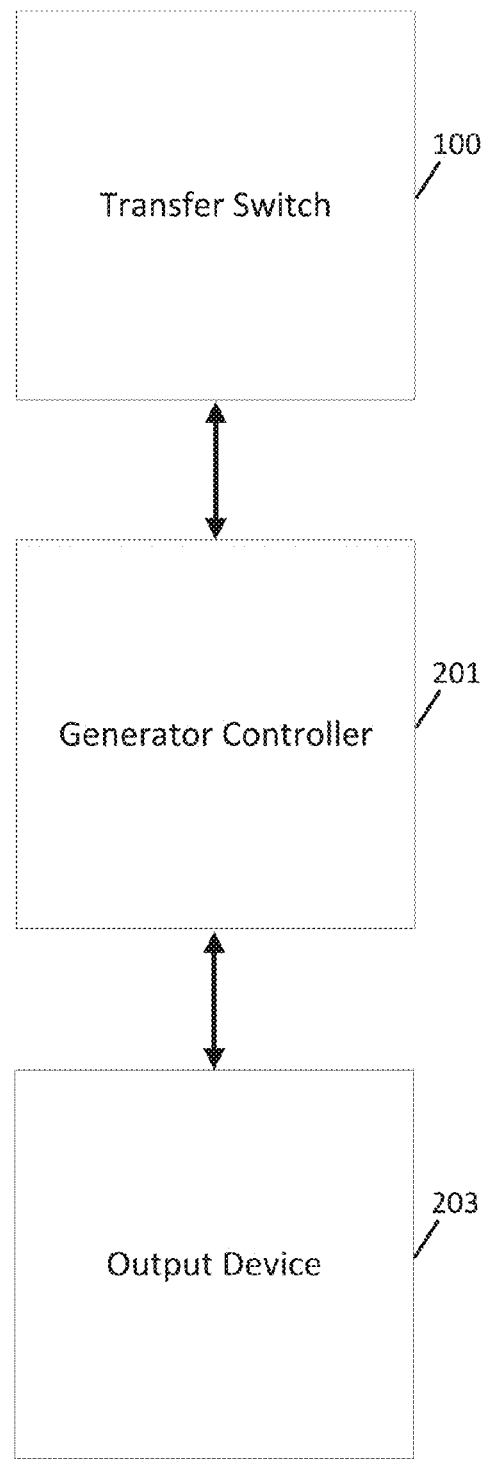
FIG. 4 illustrates a system including the transfer switch of FIGS. 1-3.

FIG. 4 an example system diagram including the transfer switch 100 of FIGS. 1-3, a generator controller 201, and an output device 203. The generator controller 201 and the transfer switch 100 may communicate via Modbus or another communication protocol. Additional, different, or fewer components may be included.

The transfer switch 100, either directly from one of the sensing circuits or after additional processing from another device, such as a load sharing control module, within the transfer switch 100, may send the load measurement signal to the generator controller 201. The load measurement signal may be a variable voltage or current defined as a function of the load current or power. The load measurement signal may include digital data indicative of the load current or power. The load sharing control module may be in the transfer switch 100 or the generator 20. The load sharing control module may monitor the output of the generator 20 to determine when more load may be placed on the generator 20. When multiple generators are used, the load sharing control module may monitor the output of multiple generators and balance the load among the multiple generators.

In one example, the load may include several components that are individually connected to the generator 20 or multiple generators through a set of relays or another type of switches. The components of the load may be machines or equipment in a building or an industrial setting. The components of the load may be an adjacent series of apartments, homes, offices, or businesses. The components of the load may be homes or condominiums. Each of the components is connected to the generator 20 or multiple generators through a relay. The load sharing control module may generate control signals for each of the set of relays to selectively connect and disconnects loads (or the size of the load) on the generator 20 or multiple generators. The load sharing control module may target the generator 20 or multiple generators to a predetermined percentage (e.g., 80% or 90%) of capacity.

In addition or in the alternative, a measurement signal may be sent to the generator controller 201 from two or more of the sensing circuits. The generator controller 201 may calculate the utility power, for example, by subtracting the generator output level from the load measurement signal.

The generator controller 201 may also initiate operation, or adjust operation, of the generator 20 based on the subtraction levels derived from the utility sensing circuit 103 from the load measurement signal. In other words, the generator controller 201 may identify the need for power from the generator by comparing the change in the power level of the utility with respect to the power level of load. Therefore, the generator controller 201 may determine when to start, stop, increase output, or decrease output, of the generator 20 based on the utility sensing circuit 103 or the load sensing circuit 105.

Figure 5:
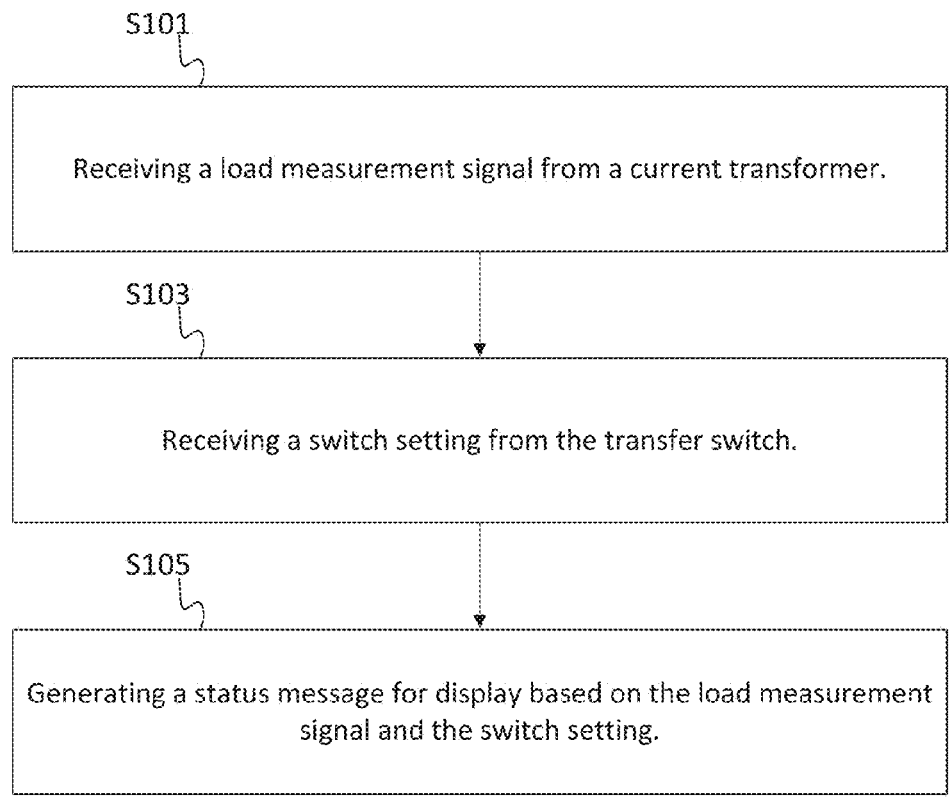
FIG. 5 an example flowchart for the operations of the transfer switch or generator controller of FIG. 4.

FIG. 5 illustrates an example flowchart for the operations of the transfer switch or generator controller of FIG. 4. The flowchart may include additional, different, or fewer acts. Acts may be omitted, repeated, or performed in the displayed order or in a different order.

At act S101, the generator controller 201 receives a load measurement signal from a current transformer in the transfer switch 100. At act S103, the generator controller 201 also receives a switch setting from the transfer switch 100. The switch setting may describe the current position of switch 101. The position may indicate that only utility power is being output to the load, only generator power is being output to the load, or a combination of utility power and generator power is being output to the load. The switch setting may include a ratio (R) that relates the amount of generator power and the utility power $$\left(R = \frac{P_{GEN}}{P_{UTILITY}}\right).$$

Example ratios include 0.1, 0.5, 10%, 50%, 2, 10, or 5. Alternatively, the ratio may relate the amount of generator current to utility current or the inverse of any of these examples.

At act S105, the generator controller 201 may also generate a status message for display based on the load measurement signal and the switch setting. The status message may include a home usage level based on the load measurement signal and the switch setting. The home usage level may include the ratio (R) and/or the total amount of power being output to the load. The status message may also include data or a graphic indicative of the operating level of the generator. The operating level may be data or a data indicative of a percentage of full capacity of the generator $$\left(GenLevel = \frac{P_{GEN}}{P_{CAPACITY}}\right)$$

or a percentage of the load supplied by the generator $$\left(GenLevel = \frac{P_{GEN}}{P_{LOAD}}\right).$$

The capacity of the generator may be predetermined and stored or configurable and input to the generator controller 201. Other variations are possible.

Figure 6:
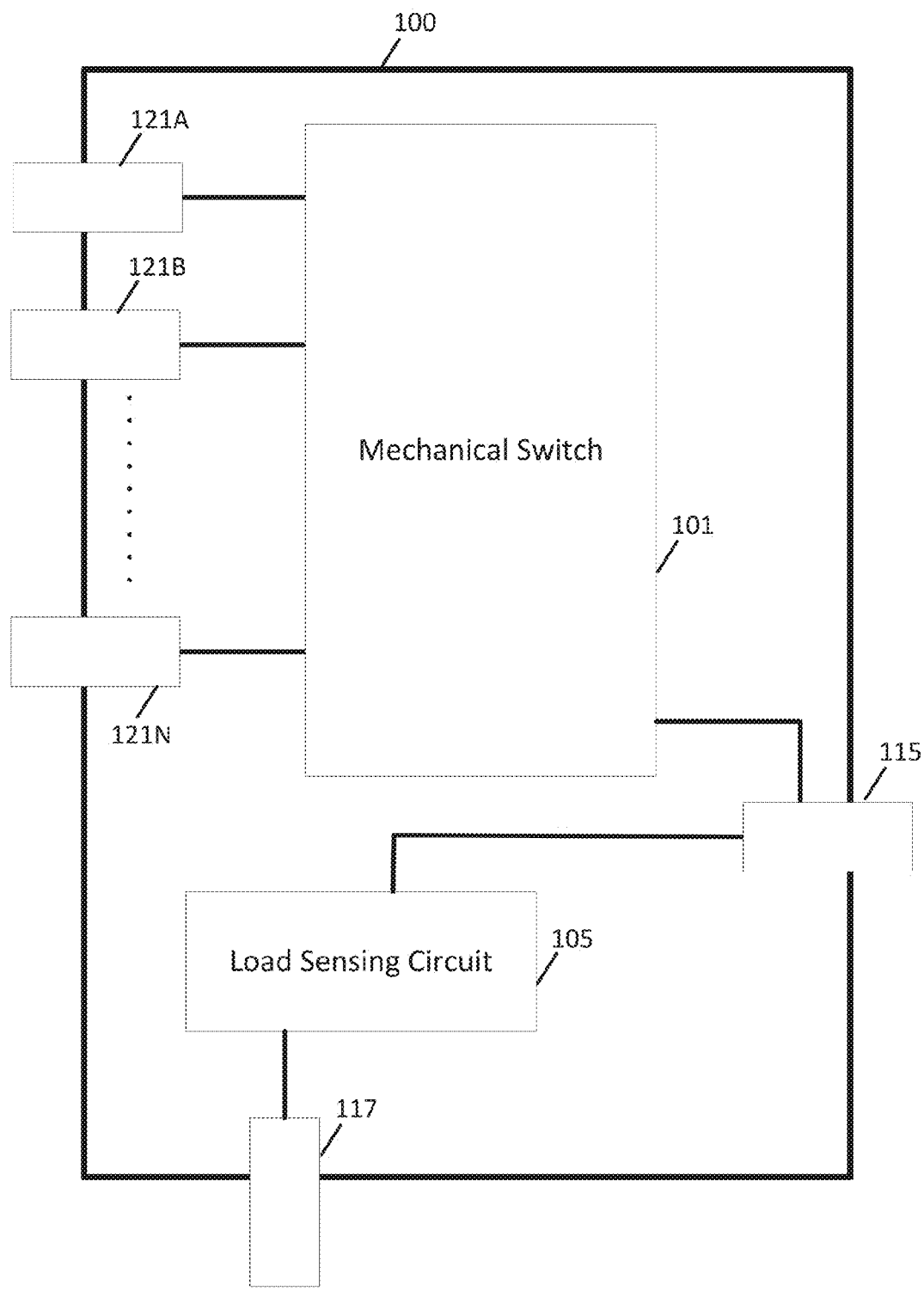
FIG. 6 illustrates another example transfer switch of FIG. 1.

FIG. 6 illustrates another example of the transfer switch 100 of FIG. 1. The transfer switch 100 includes a mechanical switch 101, a set of input ports 121A-N, a load sensing circuit 105, a load output 117, and a control output 115.

The mechanical switch 101 may include one or more relays that selectively connects any combination of the set of input ports 121A-N to the load output 117 and the load sensing circuit 105. Each relay may include an electromagnet that is electrically driven by a control signal. The control signal may be a low power signal that is electrically isolated from the power signals (e.g., load output and input ports 121A-N). The control signal energizes the electromagnetic to move a moving component in the mechanical switch 101, which connects or disconnects one or more of the set of input ports 121A-N to the load sensing circuit 105. Alternatively, the relays may be solid state relays, which omits the electromagnetic and the moving component.

The set of inputs 121A-N may be designated to one or more utility sources and one or more generator sources. Therefore, the load measurement signal generated by the load sensing circuit may include multiple generator components. A switch signal may be generated that includes the number of generator components and/or the relative contributions of each of the generator components.

The load measurement signal, via load output 117, and the switch signal, via control output 115, may be output to an external device (e.g., generator controller 201). The generator controller 201 may calculate a home consumption value based on the load measurement signal and the switch signal. The home consumption value may be the power level in the load measurement signal, which describes the total power drawn by the load entity. The home consumption value may have two components, a utility component and a generator component. The generator controller 201 may calculate the utility component and the generator component based on the load measurement signal and the switch signal. For example, when the switch signal indicates that both the generator 20 and the primary source 10 is providing power to the load entity 30, the generator controller 201 accesses a ratio value from the switch signal. In one example, the generator controller 201 multiplies the ratio value by the power level of the load measurement signal to calculate the utility component and divides power level of the load measurement signal to calculate the generator component.

In one example, the generator controller 201 includes a lookup table that associates an electrical quantity (e.g., power, frequency, phase, delay, voltage, or current) with a total home consumption value. The electrical quantity may be a property of the load measurement signal that represents that total power being used.

The generator controller 201 may also calculate usage levels of the power from the primary source 10. For example, the generator controller 201 may receive a generator level signal internally that represents the output power level, operating speed, or other characteristic of the generator 20. The generator 201 may subtract the power level of the generator 20 from the total power from the load measurement signal to calculate the power from the primary source 10. Thus, the generator controller 201 may monitor the primary source 10.

The generator controller 201 may receive load measurement signals from multiple transfer switches. Each of the transfer switches may correspond to a different apartment or condominium of a build. Each of the transfer switches may correspond to a different circuit of a home or building. For example, some high power consuming devices may be connected to the utility and a generator separate from the rest of the building using an independent transfer switch. Examples of high power consuming devices may include a hot tub, a driveway heater, a sump pump, or another device. Alternatively, the generator controller 201 may receive multiple load measurement signals from a home panel.

The generator controller 201 may derive home circuit usage levels from the multiple load measurement signals. The generator controller 201 may calculate usage allocation values that describe the current or accumulated usage from each of the circuits or high power consuming devices. The generator controller 201 may generate a status message based on the usage allocation values. The status message may describe which circuits are in operation, the current power usage of the circuits, and a total power usage of the circuits over a predetermined time period.

Figure 7:
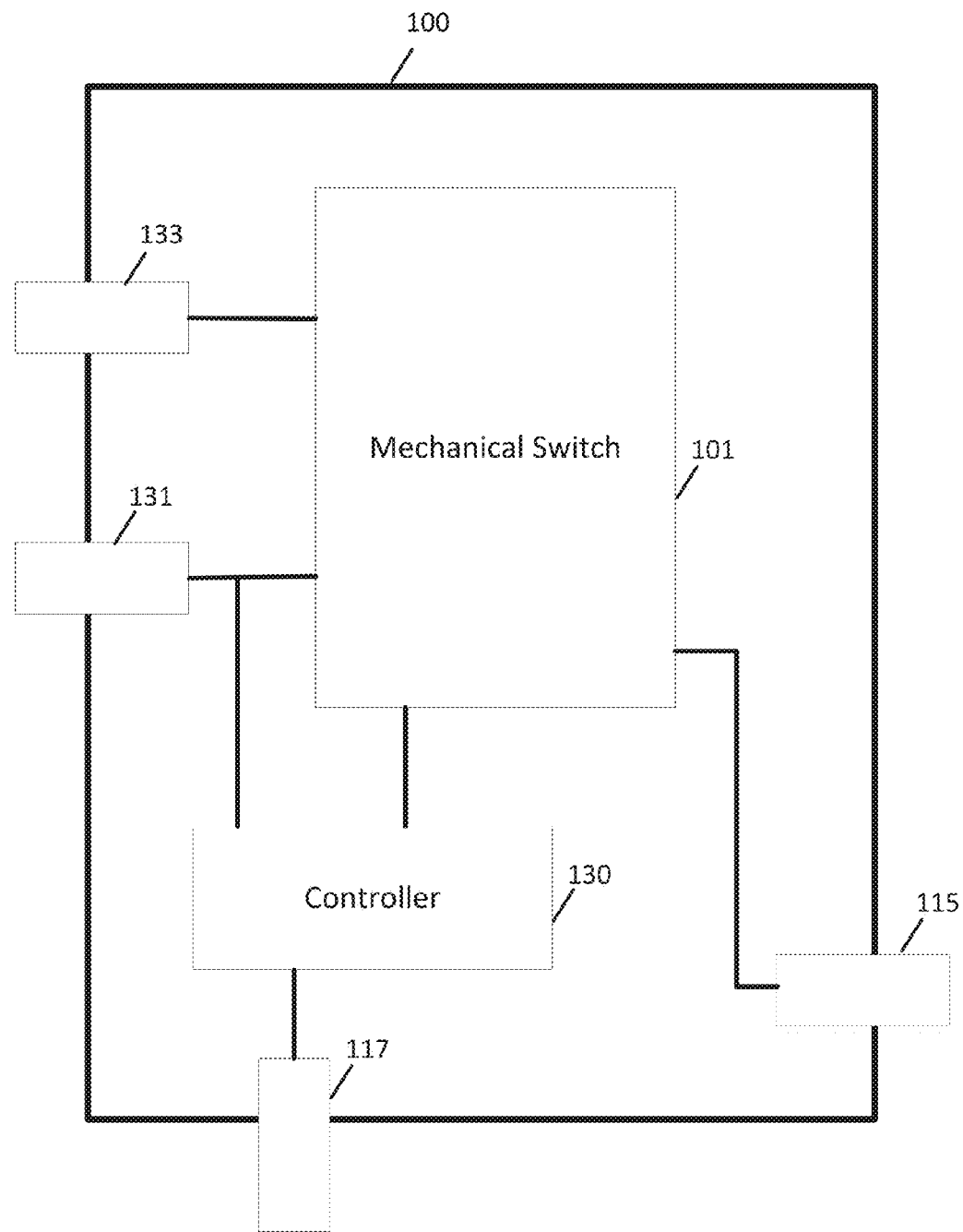
FIG. 7 illustrates another example transfer switch of FIG. 1.

FIG. 7 illustrates another example transfer switch 100 of FIG. 1. In addition to the components described above, the example of FIG. 7 includes a controller 130 instead of the load sensing circuit. A utility input 133 is in electrical communication with a utility source. A generator input 131 is in electrical communication with the generator.

The controller 130 may include a load sensing circuit or otherwise generate a load measurement signal based on a power output of the mechanical switch 101. The controller 130 may measure an electrical quantity from the load measurement signal and query a lookup table with the electrical quantity. The electrical quantity may be a voltage level, a current level, or a power level. The lookup table may associate the electrical quantity with a total home consumption value that indicates how much electricity is being used by the home or business.

The controller 130 may also monitor and record the amount of power supplied by the utility. The controller 130 may receive or determine a generator level signal from the generator input 131 that describes the operation or output of the generator. The controller 130 may calculate the amount of power received from the utility as a function of the generator level signal and the load measurement signal. For example, the controller 130 may compare the generator level signal and the load measurement signal to determine whether the utility is supplying power. A message may be generated that indicates whether the utility is supplying power and/or how much power the utility is supplying.

Figure 8:
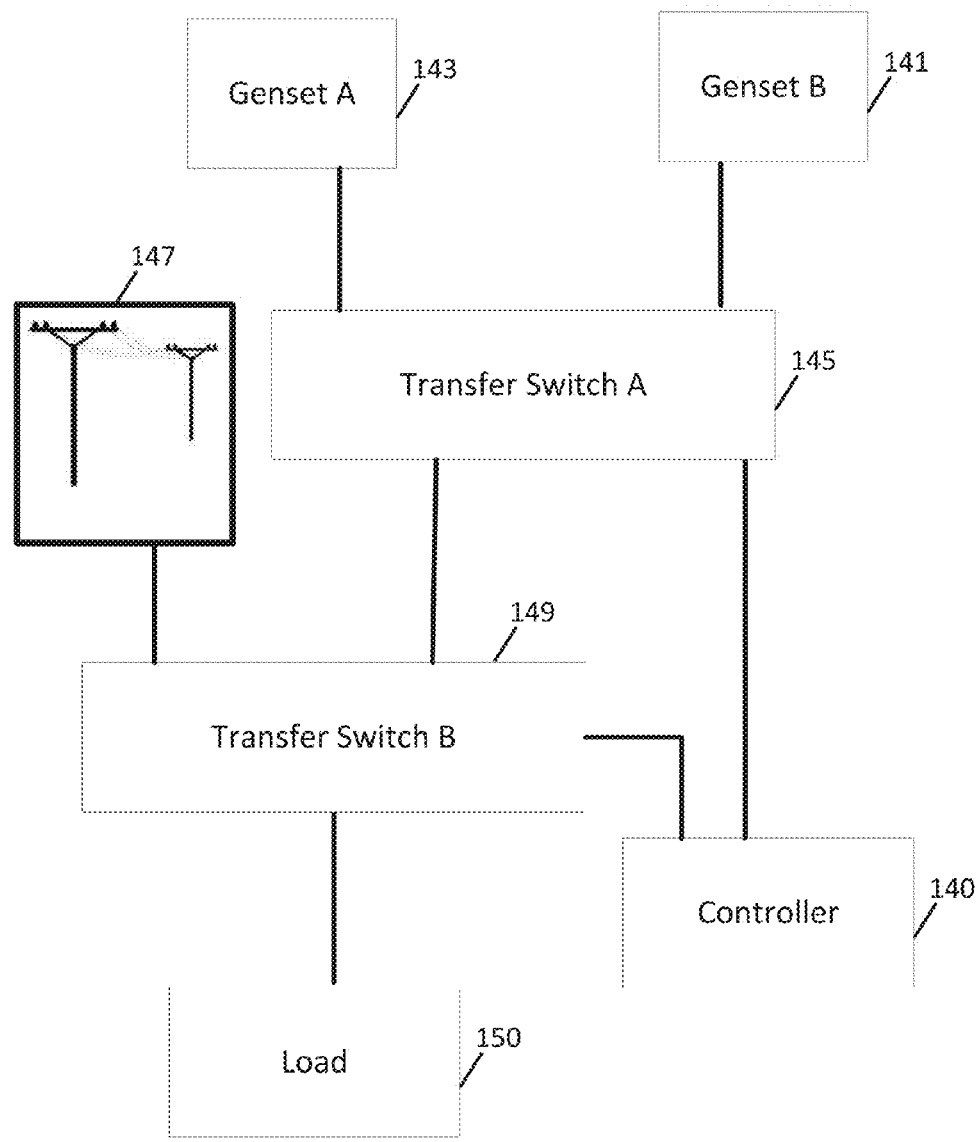
FIG. 8 illustrates an example delivery of backup power using multiple transfer switches.

FIG. 8 illustrates an example delivery of backup power using multiple transfer switches. The system in FIG. 8 includes a first genset 141, and a second genset 143, a first transfer switch 145, a second transfer switch 149, and a controller 140. The system is coupled with a primary power source 147 (e.g., utility) and a load 150. Additional, fewer, or different components may be included. The term genset refers to an engine-generator set, which includes an engine and an alternator or another device for generating electrical energy. The first genset 141 and second genset 143 may be electrically coupled through wiring to a bus. Any number of gensets may be used. The gensets may be powered by diesel, fuel oil, gasoline a gaseous fuel such as liquefied petroleum gas (LPG), hydrogen gas, natural gas, biogas, or another gas, or another fuel or combination of fuels.

The controller 140 may manage multiple gensets using multiple transfer switches. A transfer switch array, which includes the first transfer switch 145 and the second transfer switch 149, but may include any number of transfer switches, may supply power to the load 150 from multiple generator sets. The transfer switch array may generate multiple switch signals that describe the current power sources delivered to the load 150. The controller 140 may calculate the load measurement signal based on the output of the second transfer switch 149 and a switch signal from the first transfer switch 145 and/or a switch signal from the second transfer switch 149.

Figure 9:
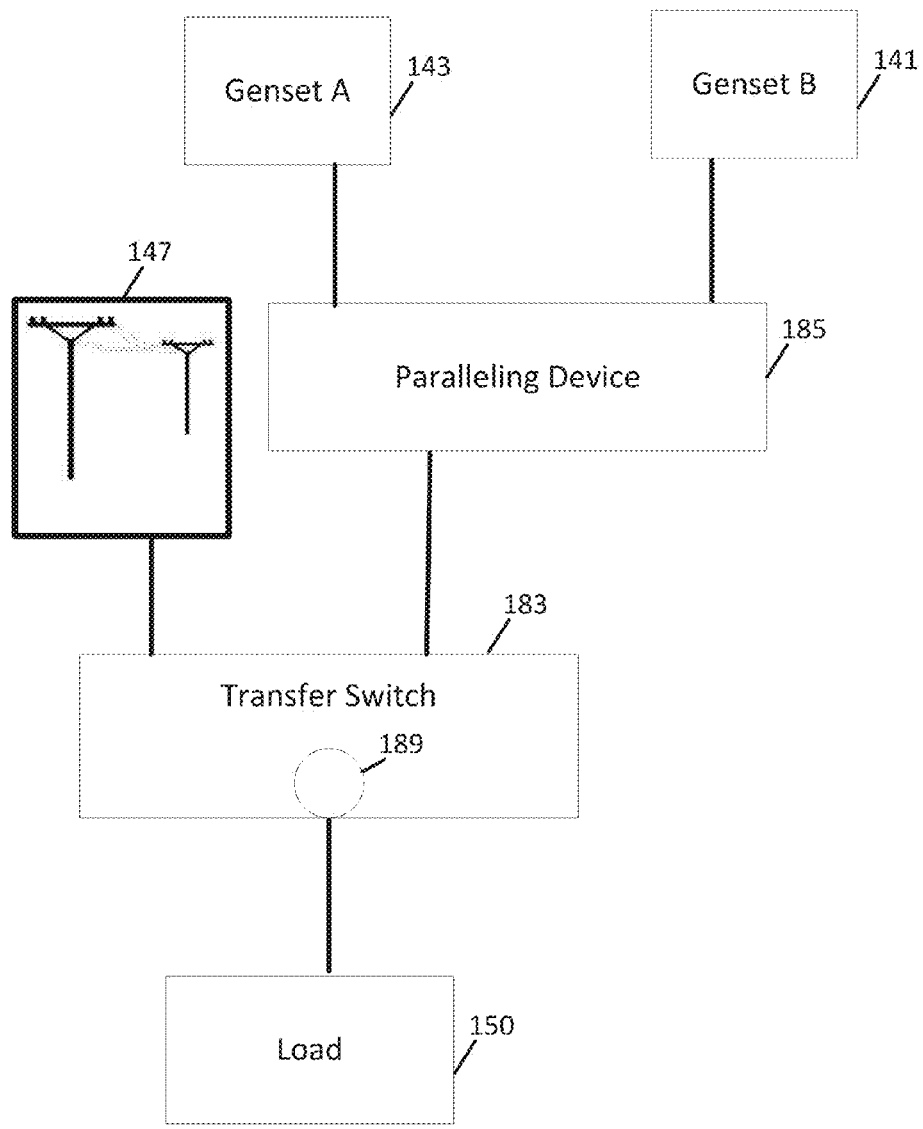
FIG. 9 illustrates an example delivery of backup power using a paralleling module.

FIG. 9 illustrates an example delivery of backup power using a paralleling device. The system in FIG. 9 includes a first genset 141, and a second genset 143, and is coupled with a primary power source 147 and a load 150. The system also includes a paralleling device 185 and a transfer switch 183 including an internal current transformer 189. Additional, fewer, or different components may be included.

The paralleling device 185 may automatically synchronize the first genset 141 and the second genset 143. The paralleling device 185 may interface with controllers of the first genset 141 and the second genset 143 to detect the operation (e.g., speed, output current, output power, phase, or another quantity) to close circuit breakers that combine the outputs of the first genset 141 and the second genset 143 to a single output, which is provided to the transfer switch 183. The paralleling device 185 may also add or remove either of the generators as the load 150 increases or decreases and/or the power provided by the primary power source 147 increases or decreases. As described above, the load 150 coupled to the transfer switch 183 may be measured by the current transformer 189 internal to the transfer switch 183. Optionally, in addition or in the alternative to the current transformer 189, the transfer switch 183 may include one or more current transformers at the inputs from the primary power source 147, the paralleling device 185, or both.

Figure 10:
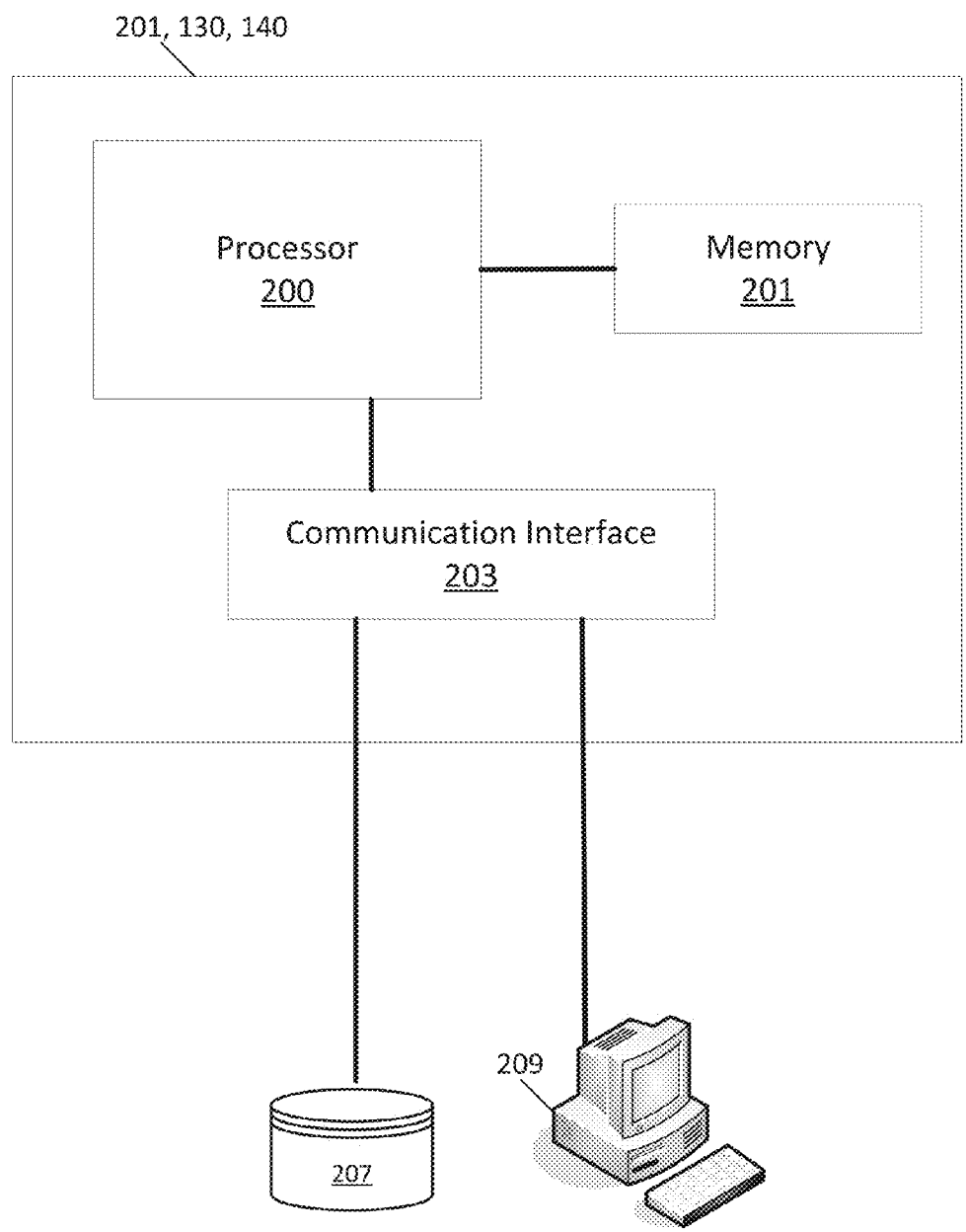
FIG. 10 illustrates an example of a controller of the generator of FIG. 1 or 6.

FIG. 10 illustrates an example of a controller or control system of the generator of FIG. 1, 6, or 8. The control system may include any of the controllers described herein (e.g., controller 201, controller 130, and/or controller 140). The control system includes a controller having at least a processor 200, a memory 201, and a communication interface 203. The controller may be coupled with a database 207 and/or a workstation 209. The workstation 209 may receive various user settings such as threshold levels for power consumption of the load, generator capacities, sampling rates, or other information. Additional, fewer, or different components or arrangements are possible.

The communication interface 203 may receive a load measurement signal from one or more current transformers electrically coupled to a switch for a generator. The current transformer may be coupled to the output of the switch. A conductive element (e.g., a wire) of the output may function as the primary winding of the current transformer.

The current transformer may be a wound current transformer, a toroidal current transformer, or another type of current transformer. A wound current transformer may include a primary winding that is wound around the core a predetermined number of times. The number may be any integer from 1 to N such that N is less than the number of times the secondary winding is wrapped around the core. Examples for the number for the primary winding of a wound current transformer may be 1, 2, or 3. The ratio of the number of windings in the secondary winding to the number of windings in the primary winding is substantially equal to the ratio of the measured current to the output current. Example ratios include 20, 50, 100, or another value.

In a toroidal current transformer, the primary winding, which carries the current to be measured, is not wound around the core. Instead, the primary winding passes through a hole in the core. In other words, the number of windings for the primary winding is zero.

The output of the switch may also be coupled with a circuit breaker. The circuit breaker switches off the power leaving the transfer switch. The circuit breaker may be controlled by the output of the current transformer. That is, when the output power of the transfer switch reaches a predetermined threshold, the circuit breaker may be moved from closed to open, which stops power from reaching the load.

The processor 200, which may be referred to as a control module, may sample the load measurement signal at a predetermined schedule. The predetermined schedule may include intervals. Examples intervals include 1 millisecond, 1 second, 1 minute, 1 hour, or another value. The memory 201 or database 207 may store a lookup table defining home consumption values. The processor 200 may access the lookup table according to at least one sample from the load measurement signal to receive a home consumption value and generate a status message based on the home consumption value. The memory 201 may store the home consumption values along with timestamps corresponding to when the home consumption values were collected.

In addition or in the alternative, the status message may indicate the power inputs of the transfer switch or automatic transfer switch. The status message may indicate that only utility power is being used, only generator power is being used, or a combination of both power sources is being used. The status message may describe how much power is received from the utility source and how much power is received from the generator source.

Figure 11:
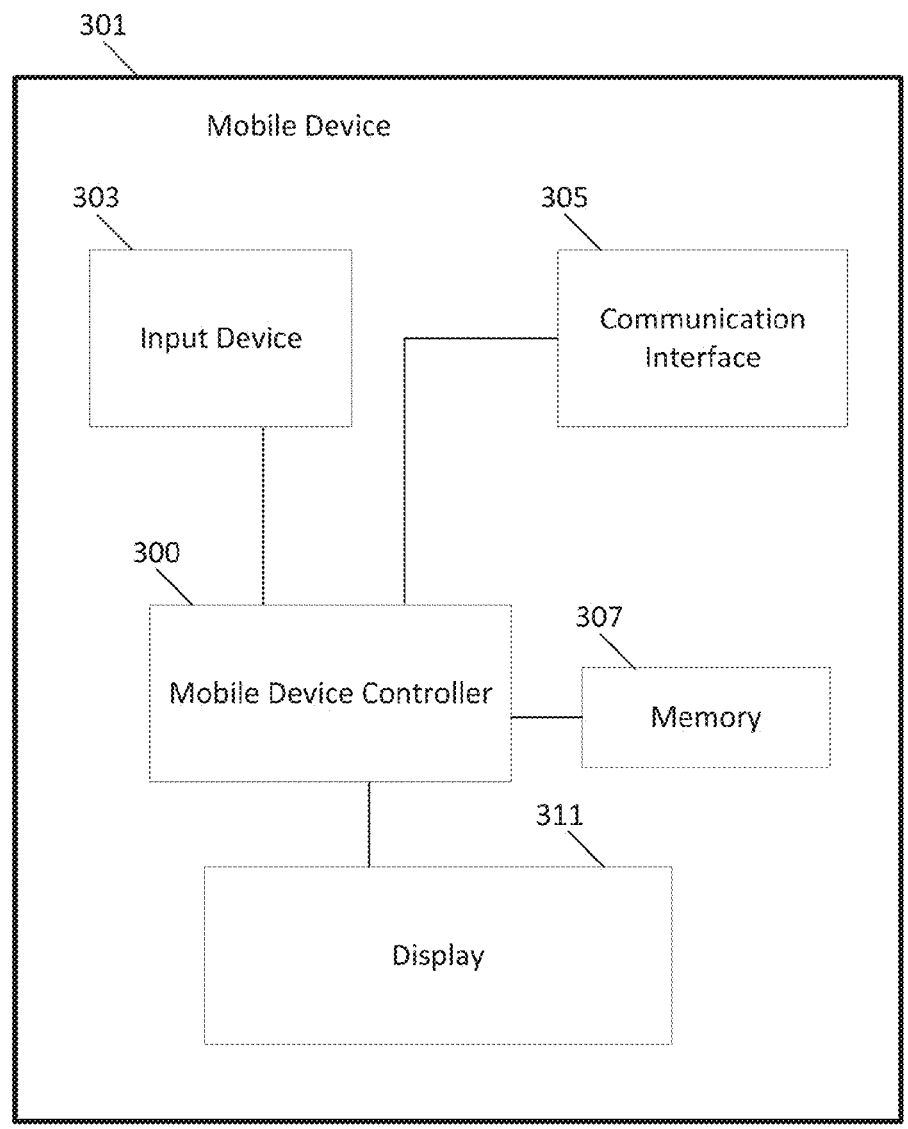
FIG. 11 illustrates a mobile device for monitoring power delivery.
Figure 12:
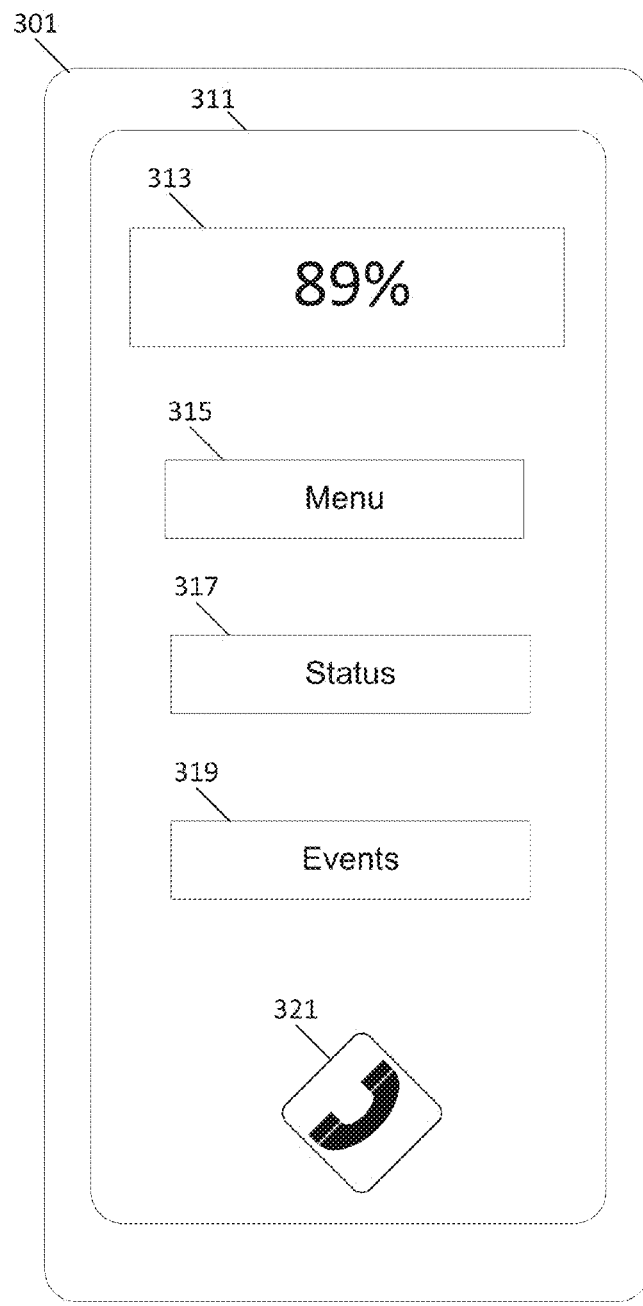
FIG. 12 illustrates an example application for monitoring power delivery.

FIG. 11 illustrates a mobile device 301 for monitoring power delivery. The mobile device 301 includes a mobile device controller 300, an input device 303, a communication interface 305, a memory 307, and a display 311. Additional, different, or fewer components may be included. FIG. 12 illustrates an example application running on display 311 for monitoring power delivery. The mobile application may include a usage value 313, a menu button 315, a status button 317, an events button 319, and a communication button 321. Additional, different, or fewer functions or features may be included in the mobile application.

The generator controller 130, or any of the controllers, may be in communication with a data network (e.g., cellular phone network, the internet) to communicate with the mobile device 301 through the communication interface 305. The mobile device 301 may display the status message generated at the generator controller 301 or process data received from the generator controller 301 to generate a status message or an error message. The user of the mobile device 301 may access a mobile application to receive information about the user's home power usage.

The mobile device controller 300 may process usage data received from the generator controller 130. For example, the mobile device controller 300 may compare the usage data to threshold levels set by the user. The mobile device controller 300 may record usage data in memory 307.

The display 311 includes the amount of power being consumed in the home via the usage value 313. The amount of power may be described in kilowatt-hours or in percentage of capacity (e.g., the capacity of the electrical panel). In another example, the display 311 includes a breakdown of the amount of power supply by the utility company and an amount of power produced by generators or another source (e.g., windmill or solar).

The input device 303 may receive a command from the user. The command may instruct the mobile application to request a reading from the generator controller 130 through the network. The command may also be sent to the generator controller 130 to control an aspect of the transfer switch or generator.

For example, the display 311 may show usage levels of multiple home circuits as described above. The usage level may indicate an error or a problem with one of the circuits. The command may instruct the generator controller 130, transfer switch 100, or home panel to deactivate a home circuit based on the usage allocation values from the status message.

For example, the user may have accidently left an appliance or lights on. The user may turn off the circuit including the appliance. In another example, the user may remotely turn off an air conditioner or heater that was left on by mistake.

The mobile application may also allow the user to monitor usage. For example, children left at home may have been instructed do laundry while the parents are away. The usage level may indicate that the laundry has not been done because the dryer would have used more power that indicated by the usage level. In another example, the children may have been instructed to stay out of the hot tub. The usage level may indicate that the circuit for the hot tub has used significant power.

The menu button 315 may bring up a menu that allows the user to enter settings. The settings may include threshold values for the usage levels. The status button 317 may initiate a request to the generator controller 130 to take a sample or reading of the load measurement signal. The events button 319 may cause the mobile application to present a history of power usage. The history of power usage may include usage values associated with time stamps. The historical information may be calculated by the generator controller 130 or by the processor 300. The communication button 321 may initiate a communication related to the mobile application. The communication may be an email, a phone call, a text message, or another communication. The communication may be sent to a service provider for the generator, to the utility company, or to the residence or business where the monitoring is taking place.

The mobile application may also include a function for auditing the power company. The amount of power supplied by the power company may be calculated from the total load power (e.g., load measurement signal) and the generator power (e.g., generator signal). The calculation may be made at the transfer switch 100, at the generator controller 130, or at the mobile application. The mobile application may also access an account at the power company. The mobile application compares that usage information reported by the power company to the usage levels calculated based on the load measurement signal.

The mobile application may include a function to determine power consumption among multiple apartments, condominiums, town homes, strip malls, or offices. For example, a building owner may receive multiple load measurement signals from the various units. Even if the power is not divided among units by the power company, the mobile application may provide usage values for each of the units in the building. The building owner may divide the cost of electricity among the units according to actual usage.

Figure 13:
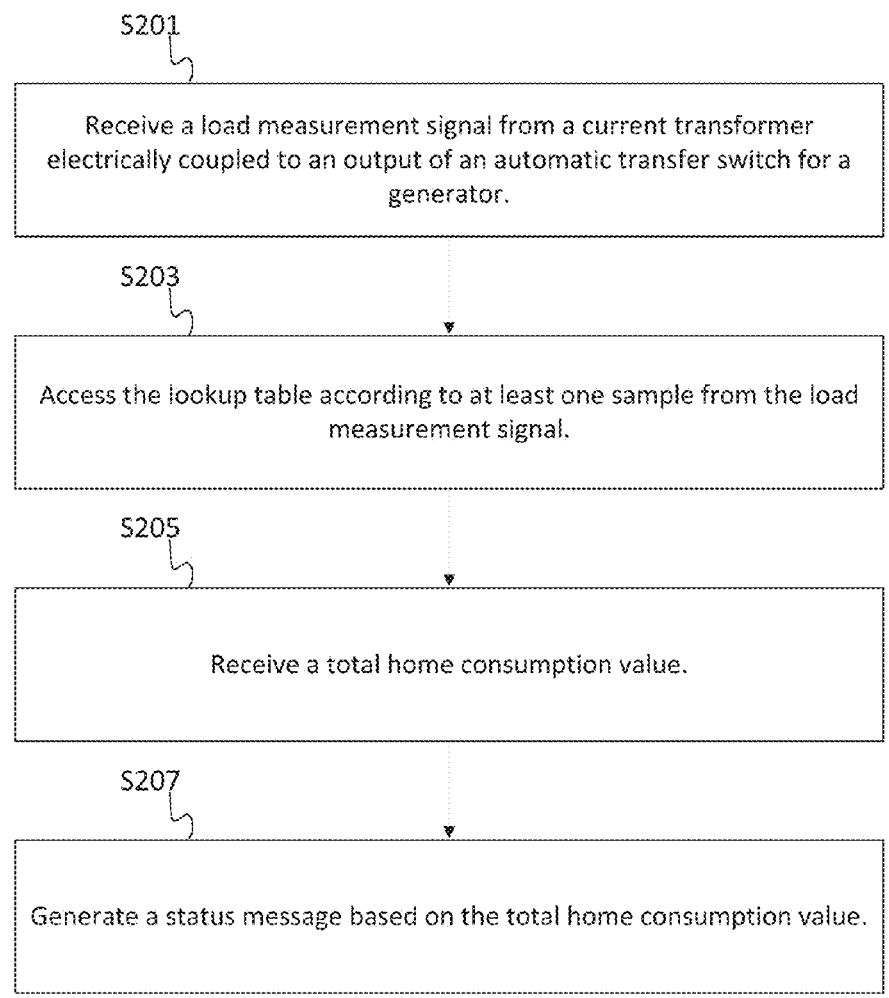
FIG. 13 illustrates an example flowchart for monitoring power delivery.

FIG. 13 illustrates an example flowchart for monitoring power delivery. Additional, different, or fewer acts may be provided. The acts may be performed in the order shown or other orders. The acts may also be repeated. The acts may be performed by any of the devices described above.

At act S201, a load measurement signal is received from the current transformer electrically coupled to the load of the automatic transfer switch. The load measurement may include a signal describing the power leaving the automatic transfer switch. The signal may be sampled according to a predetermined schedule or based on an initiation command.

At act S203, a lookup table is accessed according to one of the samples from the load measurement signal. The lookup table may match ranges for the signal values to total home consumption power levels. The total home consumption power levels may be absolute values in watts or a percentage of capacity. At act S205, at least one total home consumption power levels is returned from the lookup table.

At act S207, a status message is generated based on the at least one total home consumption power levels. The status message may describe how much power is being used by the home. The status message may describe a current percentage of capacity for the power usage. For example, the total capacity of the electrical panel is compared to the current usage to calculate a percentage of capacity.

Any combination of the processor 200, the generator controller 130, and the mobile device controller 300 may include a general processor, digital signal processor, an application specific integrated circuit (ASIC), field programmable gate array (FPGA), analog circuit, digital circuit, combinations thereof, or other now known or later developed processor. One or more of the processor 200, the generator controller 130, and the mobile device controller 300 may be a single device or combinations of devices, such as associated with a network, distributed processing, or cloud computing.

The memory 201 and memory 307 may be a volatile memory or a non-volatile memory. The memory 201 and memory 307 may include one or more of a read only memory (ROM), random access memory (RAM), a flash memory, an electronic erasable program read only memory (EEPROM), or other type of memory. The memory 201 may be removable from the controller 300 such as a secure digital (SD) memory card.

The communication interface 203 and the communication interface 305 may include any operable connection. An operable connection may be one in which signals, physical communications, and/or logical communications may be sent and/or received. An operable connection may include a physical interface, an electrical interface, and/or a data interface. The communication interface 203 and the communication interface 305 provides for wireless and/or wired communications in any now known or later developed format.

The generator controller 130 and the mobile device 301 are connected by a network. The network may include wired networks, wireless networks, or combinations thereof. The wireless network may be a cellular telephone network, an 802.11, 802.16, 802.20, or WiMax network. Further, the network may be a public network, such as the Internet, a private network, such as an intranet, or combinations thereof, and may utilize a variety of networking protocols now available or later developed including, but not limited to TCP/IP based networking protocols.

The memory 201 and/or memory 305 may be a non-transitory computer-readable medium. While the non-transitory computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and anyone or more processors of any kind of digital computer. Generally, a processor receives instructions and data from a read only memory or a random access memory or both. The essential elements of a computer are a processor for performing instructions and one or more memory devices for storing instructions and data. Generally, a computer also includes, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a device having a display, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings and described herein in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, are apparent to those of skill in the art upon reviewing the description.

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

I claim:

1. A method comprising:
   receiving a load measurement signal from a current transformer electrically coupled to an output of a switch for a generator;
   receiving a switch setting from the switch;
   receiving a generator level signal;
   performing a comparison of the generator level signal and the load measurement signal; and
   generating data for a status message for display based on the load measurement signal and the switch setting, wherein the status message indicates an operation status of a utility based on the comparison of the generator level signal and the load measurement signal.

2. The method of claim 1, further comprising:
   calculating a home usage level based on the load measurement signal and the switch setting, wherein the status message includes the home usage level.

3. The method of claim 1, wherein the load measurement signal includes utility data and generator data.

4. The method of claim 1, wherein the load measurement signal includes a plurality of generator components.

5. The method of claim 1, further comprising:
   measuring a voltage from the load measurement signal; and
   querying a lookup table with the voltage from the load measurement signal for a total home consumption value.

6. The method of claim 1, further comprising:
   receiving a plurality of home circuit usage levels; and
   calculating usage allocation values from the plurality of home circuit usage levels and the load measurement signal, wherein the status message includes the usage allocation values.

7. The method of claim 1, further comprising:
   displaying the status message at an electronic device.

8. The method of claim 7, wherein the electronic device is a mobile device.

9. The method of claim 1, wherein the status message indicates power consumption of the generator.

10. The method of claim 1, wherein the status message indicates whether the generator is offline.

11. A method comprising:
    receiving a load measurement signal from a current transformer electrically coupled to an output of a switch for a generator;
    receiving a switch setting from the switch;
    generating data for a status message for display based on the load measurement signal and the switch setting;
    receiving a plurality of home circuit usage levels;
    calculating usage allocation values from the plurality of home circuit usage levels and the load measurement signal, wherein the status message includes the usage allocation values; and
    receiving a user command to deactivate a home circuit based on the usage allocation values from the status message.

12. The method of claim 11, further comprising:
    displaying the status message at an electronic device.

13. An apparatus comprising:
    a communication interface configured to receive a load measurement signal from a current transformer electrically coupled to an output of a switch for a generator;
    a memory including a lookup table defining home consumption values; and
    a control module configured to access the lookup table according to at least one sample from the load measurement signal to receive a home consumption value and generate a status message for display based on the home consumption value, wherein the communication interface is further configured to receive a user command to deactivate one of the plurality of home circuits based on the usage allocation values from the status message.

14. The apparatus of claim 13, wherein the switch is an automatic transfer switch, and wherein the communication interface is configured to receive a switch setting from the automatic transfer switch, wherein the status message indicates one or more inputs to the automatic transfer switch based on the switch setting.

15. The apparatus of claim 13, wherein the status message is configured for display at a mobile device.

16. The apparatus of claim 13, wherein the control module is configured to calculate usage allocation values for a plurality of home circuits based on the load measurement signal, wherein the status message includes the usage allocation values.

17. The apparatus of claim 13, wherein the memory is configured to store a plurality of home consumption values along with timestamps corresponding to times when the plurality of home consumption values were collected.

18. The apparatus of claim 17, wherein the control module is configured to calculate historical information based on the plurality of home consumption values.

19. The apparatus of claim 13, further comprising:
a display configured to display the status message.

20. The apparatus of claim 13, further comprising:
a generator controller comprising the control module.

* * * * *